(12) United States Patent
Amako et al.

(10) Patent No.: US 6,507,003 B2
(45) Date of Patent: Jan. 14, 2003

(54) METHOD AND APPARATUS FOR LASER PROCESSING

(75) Inventors: Jun Amako, Shiojiri (JP); Kazushige Umetsu, Chino (JP); Hitoshi Nakao, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/919,876

(22) Filed: Aug. 2, 2001

(65) Prior Publication Data

US 2002/0021723 A1 Feb. 21, 2002

(30) Foreign Application Priority Data

Aug. 2, 2000 (JP) ......................... 2000-233822
Jul. 12, 2001 (JP) ......................... 2000-212666

(51) Int. Cl.$^7$ .............................................. B23K 26/00
(52) U.S. Cl. ................................................... 219/121.76
(58) Field of Search ..................... 219/121.6, 121.68, 219/121.69, 121.73, 121.77, 121.85, 121.76

(56) References Cited

U.S. PATENT DOCUMENTS

| | | | | |
|---|---|---|---|---|
| 4,467,172 A | * | 8/1984 | Ehrenwald et al. |
| 5,029,243 A | * | 7/1991 | Dammann et al. |
| 5,373,137 A | * | 12/1994 | McLaughlin |
| 6,031,201 A | * | 2/2000 | Amako et al. |

* cited by examiner

*Primary Examiner*—Samuel M. Heinrich
(74) *Attorney, Agent, or Firm*—Oliff & Berridge, PLC (57) ABSTRACT

The laser processing apparatus includes lasers for emitting a plurality of laser beams of different wavelengths, a common phase grating for splitting the laser beams of different wavelengths into diffraction beams shaped in designed arrays, and a condenser lens for condensing the diffraction beams. The layout of the focused diffraction beam spots of each wavelength is decided in accordance with the design of the phase grating.

15 Claims, 10 Drawing Sheets

Position normalized with the grating period

Position normalized with the grating period

METHOD AND APPARATUS FOR LASER PROCESSING

BACKGROUND

1. Field of the Invention

The present invention relates to a method and an apparatus for processing or machining a workpiece using a plurality of laser beams having different wavelengths.

2. Description of the Related Art

Figure 18:
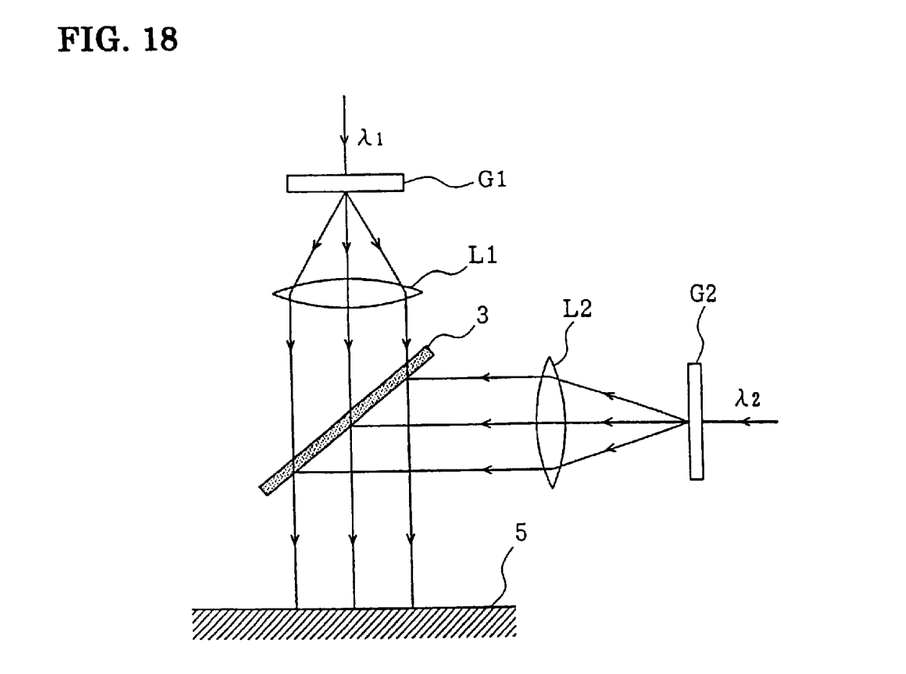
FIG. 18 illustrates a prior-art apparatus for processing a workpiece using a plurality of laser beams having different wavelengths.

FIG. 18 is a schematic diagram illustrating a prior-art apparatus for processing a workpiece using a plurality of laser beams having different wavelengths. Referring to FIG. 18, a phase grating G1 is employed to split a laser beam of wavelength $\lambda 1$ into a diffraction beams shaped in a designed array. The diffraction beam array is introduced into a condenser lens L1, then passes through an optical path combining mirror 3, and then converges to impinge on processing points of a workpiece 5. In addition, a phase grating G2 is employed to split a laser beam of wavelength $\lambda 2$ into another diffraction beam array. The diffraction beam array is introduced into a condenser lens L2, then reflected upon the optical path combining mirror 3, and then converges to impinge on the processing points of the aforementioned workpiece 5.

In this case, the diffraction beams of wavelengths $\lambda 1$ and $\lambda 2$ are focused on the same spot of the workpiece 5, thereby making it possible to allow the diffraction beam array of wavelength $\lambda 1$ to heat the workpiece 5 and the diffraction beam array of wavelength $\lambda 2$ to make holes or the likes in the workpiece 5. Processing a workpiece with a plurality of laser beams having different wavelengths at the same time as described above can improve both process quality and process yield.

However, as shown in the foregoing, diffraction beam arrays generated from a plurality of laser beams having different wavelengths have to impinge on targeted positions on a workpiece. For this purpose, it is necessary to provide a phase grating and a condenser lens for each laser beam having a different wavelength, and also dispose an adjustment unit (not shown in the figure) for adjusting the attitude and position of these elements. For this reason, the whole assembly is made complicated. In addition, the adjustment with such units is time-consuming and labor intensive to desired conditions for optimization of diffraction, thereby increasing processing costs. It is also necessary to provide an optical path combining mirror or the like between a condenser lens and a workpiece. This adds constraints to the arrangement and the specification of the optical system. Accordingly, there is a problem of making it difficult to adjust the diameter of focal spots and their intervals on the workpiece to predetermined conditions (for optimization of diffraction beam array conditions).

Furthermore, when a single laser is used which emits two or more laser beams of different wavelengths simultaneously, such a complicated arrangement has to be employed in which two beams provided on the same axis are once separated, then each of the beams is split by the splitter element, and then the split beams are combined again on the surface to be machined. As such the advantages of employing one laser instead of two lasers were not fully taken.

SUMMARY OF THE INVENTION

The present invention was developed to solve these problems. The object of the present invention is to provide a method for laser beam machining and an apparatus for implementing it that has a simple optical system to perform machining by using a plurality of laser beams of different wavelengths. In addition, the optical system is allowed to be adjusted and the laser beam array condition to be optimized in a simpler manner.

The present invention includes the steps of splitting a plurality of laser beams of different wavelengths into diffraction beams in designed arrays, respectively, by using a common phase grating, and directing those diffraction beams to a workpiece to focus and impinge on processing points of the workpiece to thereby process it. This makes it possible to reduce the number of phase gratings for splitting laser beams involved in the processing. Accordingly, the arrangement of the processing apparatus is simplified, thereby facilitating the adjustment of the optical system and the optimization of diffraction beam array conditions.

Furthermore, according to another aspect of the present invention, the diffraction beams of different wavelengths are directed to impinge on the same position on the workpiece. For example, this makes it possible to allow diffraction beams of one wavelength to heat portions of a workpiece to be processed and diffraction beams of another wavelength to make a hole or cut in these portions. In this case, it is possible to provide a beam adjusting unit for adjusting the diameter of each laser beam in its optical path so that the diffraction beams focused at the processing points on the workpiece may have the same diameter at each of these points.

Furthermore, according to another aspect of the present invention, the diffraction beams of an emitted laser beam are designed so as to have almost the same intensity. This makes it possible to perform uniform laser processing at a plurality of positions at the same time.

Furthermore, according to another aspect of the present invention, the phase grating is shifted along the optical axis of the system to adjust the impinging positions of the diffraction beams on the workpiece. This makes it possible to adjust the diameter and the interval of the focal spots of the diffraction beams for their requirement, thereby allowing for any desired processing with high accuracy.

Furthermore, according to another aspect of the present invention, two lasers of different wavelengths are used. This, among others, provides a fundamental arrangement and enables the apparatus to be substantially simplified in terms of its configuration and control as well.

Furthermore, the present invention provides a laser processing apparatus. The apparatus includes a laser means consisting of at least a single laser for emitting a plurality of laser beams of different wavelengths, a common phase grating for splitting each of the laser beams of different wavelengths into diffraction beams in a designed array, respectively, and a beam condenser for focusing the diffraction beams or laser beams incident upon the phase grating. According to this apparatus, the number of the phase gratings for splitting laser beams is reduced to simplify the apparatus, thereby facilitating the adjustment of the optical system and the optimization of the diffraction beam array conditions.

In the aforementioned case, the apparatus may be equipped with a single laser that emits a plurality of laser beams of different wavelengths. Alternatively, the apparatus may be equipped with plural lasers, each of which emits a laser beam so as to provide the plurality of laser beams of different wavelengths.

Furthermore, the laser beams of different wavelengths can be two lasers of wavelengths $\lambda 1$ and $\lambda 2$, satisfying that $m_1\lambda_1 = m_2\lambda_2$, where m1 and m2 are the diffraction orders of beams split by the phase grating. This makes it possible for two diffraction beam arrays produced from these laser beams of the two wavelengths to strike the workpiece at same points on it.

Furthermore, according to another aspect of the present invention, the apparatus has a beam adjusting unit for adjusting the diameter of a laser beam emitted from the laser means, disposed in its optical path to the phase grating. According to this apparatus, the focal spot diameter of diffraction beams on the workpiece can be adjusted. Therefore, even if using a plurality of laser beams of different wavelengths, the apparatus makes it possible to perform processing with high accuracy and high efficiency.

Furthermore, according to another aspect of the present invention, the apparatus is configured in the way that the phase grating can be positioned in the direction of the resultant optical axis after the emitted laser beams combined. This makes it possible to adjust the impinging positions of the diffraction beams on the workpiece and to perform processing with an considerably high accuracy.

Furthermore, according to another aspect of the present invention, the condenser is provided to be achromatic. In the case of using several laser beams of different wavelengths, for example, two kinds of wavelengths, the condenser can be endowed with the same focusing distance for those two wavelengths.

Furthermore, in the case of using a laser that emits pulses of different wavelengths at the same time, a spectroscopic means for passing individual pulses of different wavelengths during a specific time window prepared for each wavelength is disposed between the laser and the phase grating. This makes it possible to irradiate the workpiece alternately with diffraction beam arrays of different wavelengths.

DESCRIPTION OF THE PREFERRED EMBODIMENTS

Now, embodiments of the present invention will be explained below in more detail with reference to the accompanying drawings.

Figure 1:
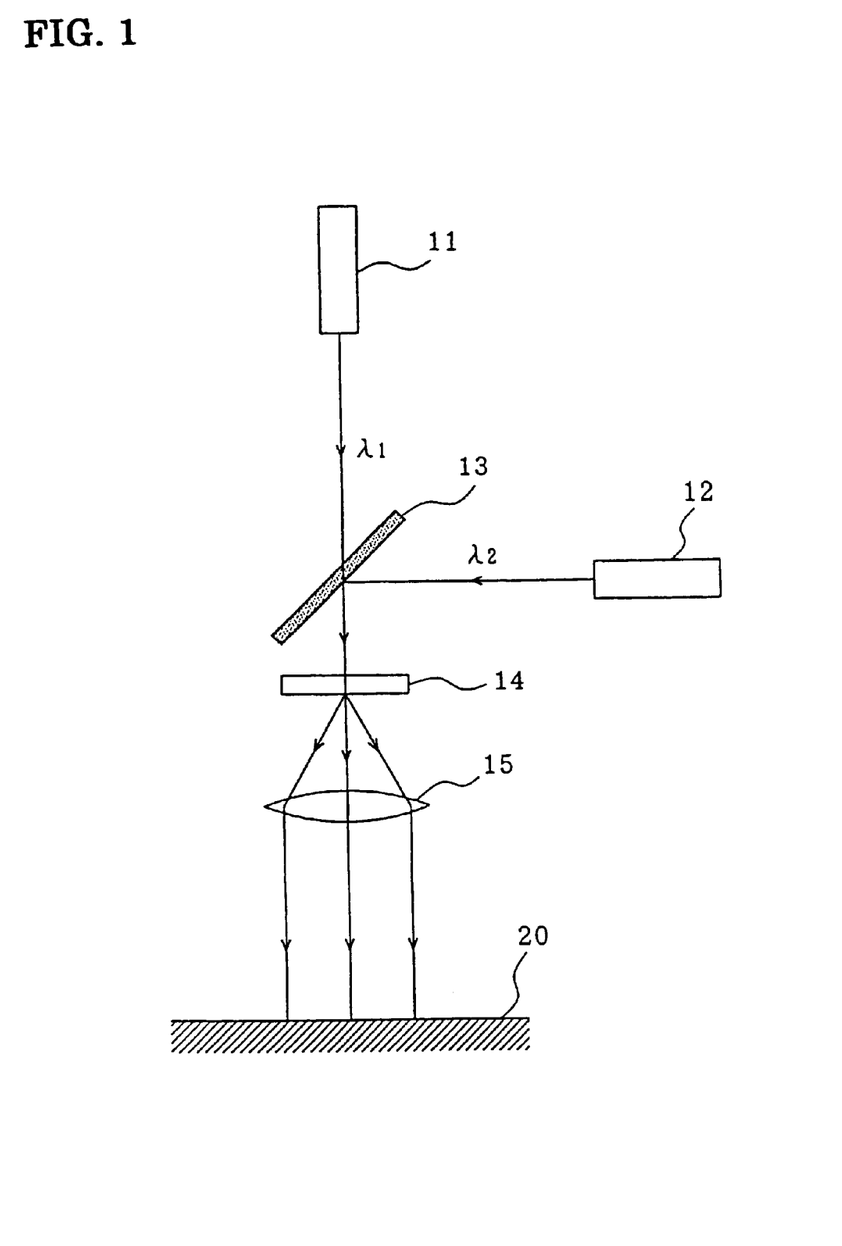
FIG. 1 illustrates an arrangement of a laser processing apparatus to be used in first and second embodiments.

FIG. 1 is a view illustrating the arrangement of a laser beam processing apparatus to be used in first and second embodiments according to the present invention. The apparatus can employ two lasers of different wavelengths (wavelengths $\lambda_1$ and $\lambda_2$).

That is, the apparatus includes a first laser 11 for emitting a laser beam of wavelength $\lambda_1$, a second laser 12 for emitting a laser beam of wavelength $\lambda_2$, and a dichroic mirror 13 as an optical path combining unit for transmitting the laser beam of wavelength $\lambda_1$ and reflecting the laser beam of wavelength $\lambda_2$. The apparatus also includes a phase grating 14 for splitting each laser beam from the optical path combining mirror 13 into a plurality of diffraction laser beams (a diffraction beam array) and a condenser lens 15 for directing the diffraction beams from the phase grating 14 to a workpiece 20 to focus and impinge on processing points of the workpiece 20. The condenser lens 15 is achromatic with the same focal length for each of two wavelengths $\lambda_1$ and $\lambda_2$. This apparatus can work for various processing applications in accordance with the beam splitting function of the phase grating 14 to be employed. The phase grating may be positioned in the direction of the resultant optical axis after the emitted laser beams combined.

Incidentally, it is herein assumed that the first laser 11 operates in continuous mode at a wavelength of 1064 nm, while the second laser 12 operates in pulse mode at a wavelength of 532 nm. However, when both the first and second lasers 11, 12 operate in pulse mode, it is necessary to manage the timing between the pulses so that the workpiece is irradiated substantially at the same time with the pulses of the two wavelengths.

First Embodiment (For irradiating a workpiece with two arrays of diffraction beams of different wavelengths, superposed on each other)

In this case, the relation between the two wavelengths $\lambda_1$ and $\lambda_2$ is decided as follows. That is, $$m_1 \lambda_1 = m_2 \lambda_2 \tag{1}$$

where m1 and m2 are the diffraction orders of split beams.

There is no limit to the choice of lasers to be used in the aforementioned apparatus. For example, if an Nd:YAG laser, which is widely used in various processing applications, is employed, wavelengths available are at least 1064 nm (fundamental), 532 nm (second harmonic), 355 nm (third harmonic), and 266 nm (fourth harmonic). Any two wavelengths selected from this group satisfy the relation given by the equation (1). The combinations are wavelengths of 1064 nm and 532 nm, 1064 nm and 355 nm, and 1064 nm and 266 nm are referred to just for example.

The aforementioned relation will be explained in more detail below. The position of the m-th diffraction order beam on a workpiece is given by the following equation.

$$x = m \cdot \lambda \cdot f/p \tag{2}$$

where $\lambda$ is the wavelength, f is the focal length of the lens, and p is the period of the phase grating.

In addition, from the equation (2), the positions of x1 and x2 of diffraction beams of two wavelengths $\lambda 1$ and $\lambda 2$ on the workpiece are given by $$x1 = m1 \cdot \lambda 1 \cdot f/p \tag{3-1}$$

$$x2 = m2 \cdot \lambda 2 \cdot f/p \tag{3-2}$$

where again m1 and m2 are the diffraction orders of beams split by the phase grating 14, and f and p are common to the two wavelengths $\lambda 1$ and $\lambda 2$. Furthermore, using an achromatic condenser lens for the wavelengths $\lambda 1$ and $\lambda 2$, it provides the same focal length (i.e., f in the equations (3-1) and (3-2)) for these two wavelengths.

To irradiate the same positions on the workpiece with the is diffraction beams of two wavelengths $\lambda 1$ and $\lambda 2$, x1 from the equation (3-1) should be equated with X2 from the equation (3-2). That is, the following equation must be satisfied.

$$m1\lambda 1 = m2\lambda 2 \tag{4}$$

For example, if $\lambda 1$ is 1064 nm and $\lambda 2$ is 532 nm, then the diffraction orders m1 and m2, required for each of the wavelengths, need to be selected so as to satisfy the following relation.

$$2m1 = m2 \tag{5}$$

Suppose that a laser beam is split into nine beams, as an example, from the equation (5), if m1=0, ±1, ±2, ±3, ±4 for 1064 nm, m2=0, ±2, ±4, ±6, and ±8 for 532 nm. The nine diffraction beams, reproduced from the laser beams of the respective wavelengths, are to overlap each other on the workpiece to be processed.

Note that the above-mentioned scheme with a nine-split array illumination may apply to a different number of splits and different patterns of diffraction beams.

The phase grating to be employed for the present invention is designed in consideration of wavelengths $\lambda 1$ and $\lambda 2$ at the same time. Thus, the phase grating has multi phase levels and one period of the phase grating is divided into pixels, each of which is provided with a designed phase level. The phase grating needs to be designed using an iterative optimization method. For example, simulated annealing can be used, and how to apply it for solving optimization problems is explained, for example, in "Journal of Optical Society of America", A/Vol.5, No.1, January 1998, pp30–38. In design, it is assumed that the phase distribution in the phase grating is digitized in a step wise manner. The design parameters are pixel and phase. Within the scope of scalar optics, the intensity Im of the m-th order diffraction beam is computed by $$Im = (1/p) \int \exp(j(\phi(x) + 2\pi m x/p)) dx \tag{6}$$

where again p is the length of a grating period, $\phi(x)$ is a digitized phase distribution given by that $\phi(x) = 2\pi(n(\lambda) - 1)h(x)/\lambda$, $\lambda$ is the wavelength, $n(\lambda)$ is the refractive index of the grating medium, and x is the positional coordinate. That is, Im is a function of wavelength $\lambda$.

For two wavelengths, the phase distributions $\phi 1(x)$, $\phi 2(x)$, corresponding to each wavelength, are given as follows.

$$\phi 1(x) = 2\pi(n(\lambda 1) - 1)h(x)/\lambda 1 \tag{7}$$

$$\phi 2(x) = 2\pi(n(\lambda 2) - 1)h(x)/\lambda 2 \tag{8}$$

The merit function F which is used for designing a grating that functions for two wavelengths, is defined as follows.

$$F = w1\Sigma(Im(\lambda 1) - \alpha(\lambda 1))^2 + w2\Sigma im(\lambda 1)^2 + w3\Sigma(Im(\lambda 2) - \alpha(\lambda 2))^2 + w4\Sigma im(\lambda 2)^2 \tag{9}$$

Where w1, w2, w3, and w4 are weighting coefficients for achieving a balance in diffraction property between the competing two wavelengths. In the equation (9), the first and second terms are to realize the splitting performance required for wavelength $\lambda 1$. The first term is to uniformly assign as much energy as possible to diffraction beams necessary for processing, while the second term is to restrict the diffraction beams unnecessary for processing. On the other hand, the third and fourth terms are to realize the splitting performance required for wavelength $\lambda 2$. The third term is to uniformly assign as much energy as possible to diffraction beams necessary for processing, while the fourth term is to restrict the diffraction beams unnecessary for processing. In the equation (9), "$\alpha( )$" is a target for diffraction beam intensities. Furthermore, $\Sigma$ indicates the sum of a plurality of diffraction beams in question. The merit function can be defined in more than one ways and the above-mentioned definition is only an example. Factors to successful grating design include the initial phase distribution, the annealing conditions, and the weighting coefficients. The maximum phase modulation depth can be selected, for example, to be 2 pai for the longer of two wavelengths under consideration.

For designing the phase grating, it is necessary to consider the wavelength-dependent refractive index of the grating medium. For example, suppose that fused quartz is employed as the grating medium. In this case, the refractive index is 1.45, 1.46, 1.48 and 1.5 for the wavelengths of 1064, 532, 355 and 266 nm, respectively.

Shown below are three design cases that can be employed in the first embodiment.

Example (a) for a combination of $\lambda 1 = 1064$ nm and $\lambda 2 = 532$ nm

Number of split beams: 9
Orders of diffraction:

m1=0, ±1, ±2, ±3, ±4 m2=0, ±2, ±4, ±6, ±8

Number of pixels per period: 40
Number of phase levels: 32 (values from 0 to 31)
Maximum phase modulation depth: $2\pi$ for 1064 nm
Diffractive properties for 1064 nm: light-use efficiency of 81% and uniformity of 0.92
Diffractive properties for 532 nm: light-use efficiency of 85% and uniformity of 0.95

Figure 2:
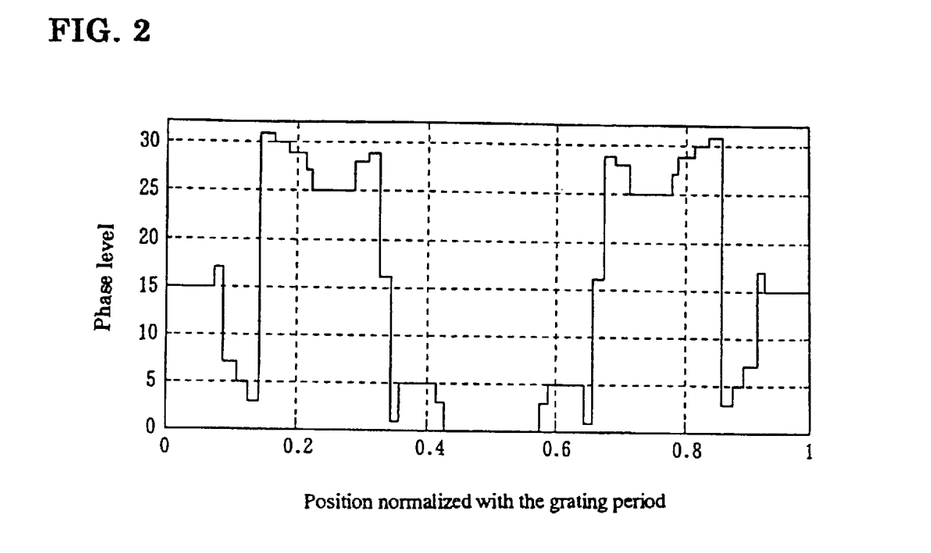
FIG. 2 shows the phase distribution of the phase grating in accordance with the design condition (a)
Figure 3:
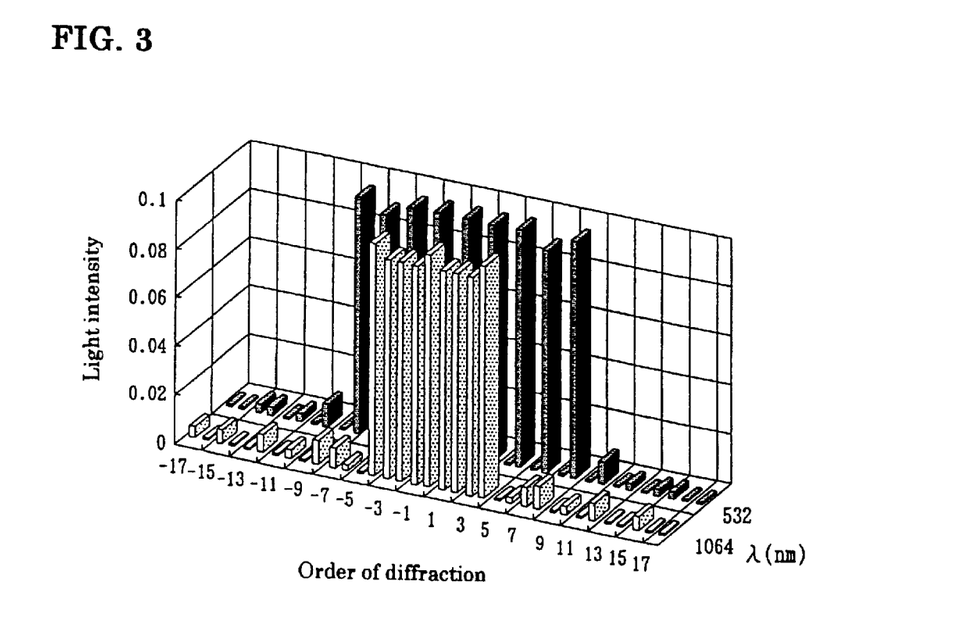
FIG. 3 shows the intensity distribution of beams diffracted by the phase grating in accordance with the design condition (a)

Incidentally, FIG. 2 illustrates the phase distribution of the phase grating for this case, while FIG. 3 illustrates the intensity distribution of beams diffracted by the phase grating.

Example (b) for a combination of λ1=1064 nm and λ2=355 nm

Number of split beams: 9
Orders of diffraction:

m1=0, ±1, ±2, ±3, ±4 m2=0, ±3, ±6, ±9, ±12

Number of pixels per period: 42
Number of phase levels: 32 (values from 0 to 31)
Maximum phase modulation depth: 2π for 1064 nm
Diffractive properties for 1064 nm: light-use efficiency of 86% and uniformity of 0.95
Diffractive properties for 355 nm: light-use efficiency of 84% and uniformity of 0.98

Figure 4:
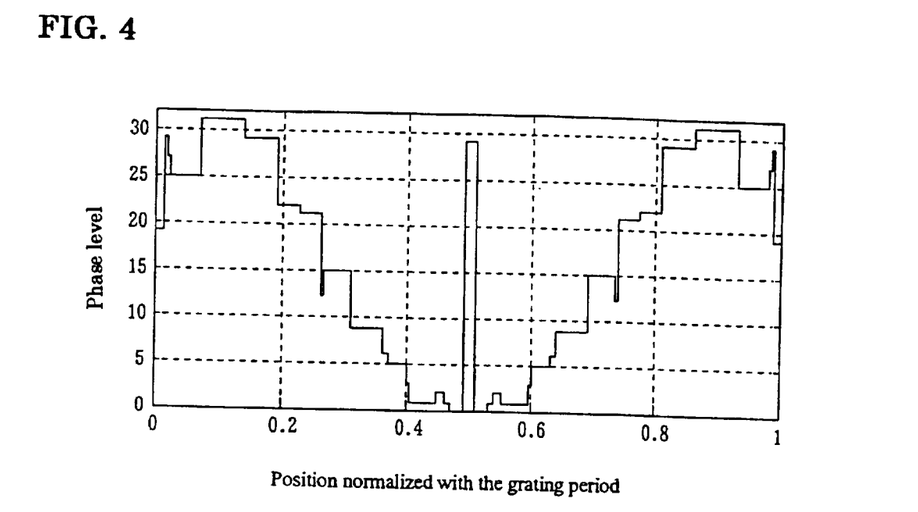
FIG. 4 shows the phase distribution of the phase grating in accordance with the design condition (b)
Figure 5:
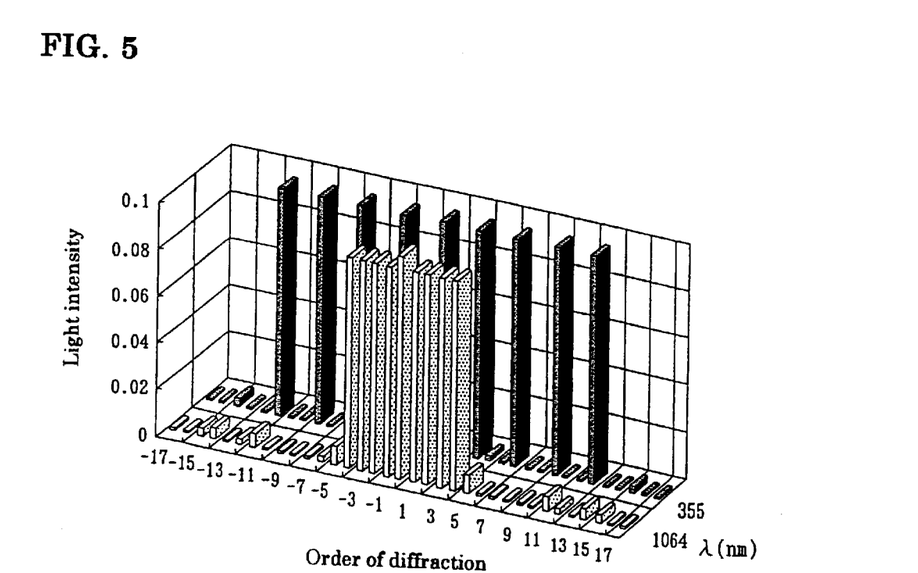
FIG. 5 shows the intensity distribution of beams diffracted by the phase grating in accordance with the design condition (b)

Incidentally, FIG. 4 illustrates the phase distribution of the phase grating for this case, while FIG. 5 illustrates the intensity distribution of beams diffracted by the phase grating.

Example (c) for a combination of λ1=1064 nm and λ2=266 nm

Number of split beams: 9
Orders of diffraction:

m1=0, ±1, ±2, ±3, ±4 m2=0, ±4, ±8, ±12, ±16

Number of pixels per period: 42
Number of phase levels: 32 (values from 0 to 31)
Maximum phase modulation depth: 2π for 1064 nm
Diffractive properties for 1064 nm: light-use efficiency of 84% and uniformity of 0.96
Diffractive properties for 266 nm: light-use efficiency of 83% and uniformity of 0.94

Figure 6:
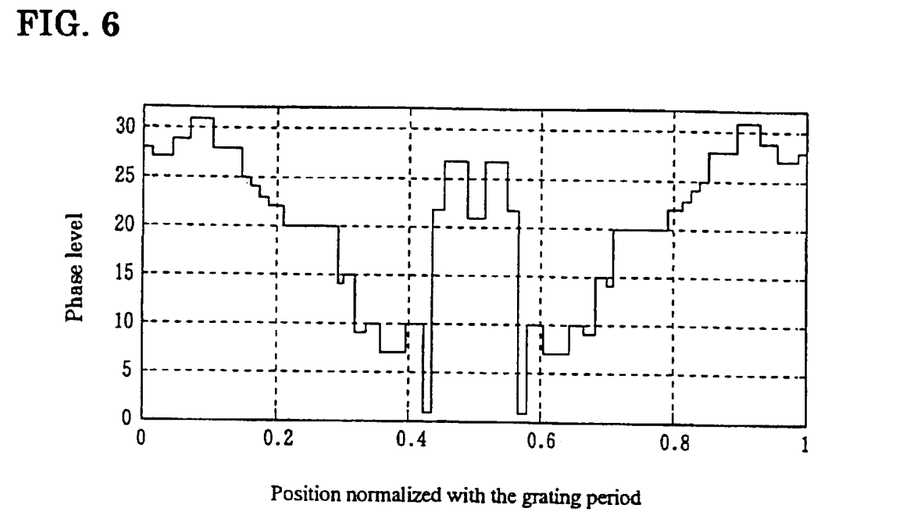
FIG. 6 shows the phase distribution of the phase grating in accordance with the design condition (c)
Figure 7:
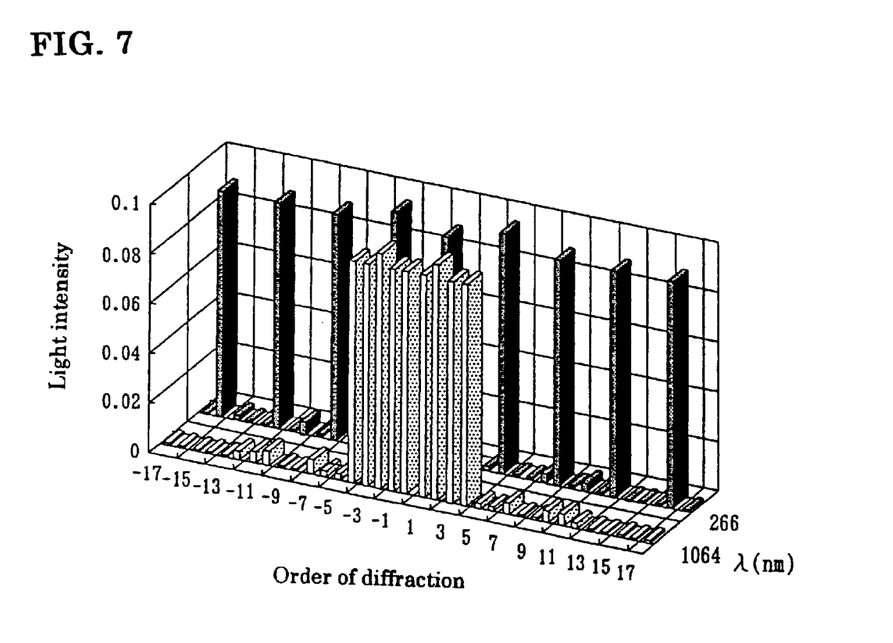
FIG. 7 shows the intensity distribution of beams diffracted by the phase grating in accordance with the design condition (c)

Incidentally, FIG. 6 illustrates the phase distribution of the phase grating for this case, while FIG. 7 illustrates the intensity distribution of beams diffracted by the phase grating.

In addition, the depth h of an actual phase grating can be decided by $$h=(\phi/2\pi)\cdot(\lambda/(n-1))=(N/Q)\cdot(\lambda/(n-1)) \quad (10)$$

where $\phi$ is the phase modulation depth, $\lambda$ is the wavelength, n is the refractive index of the material, N is the phase value (N=0,1,2, ... (Q−1)), and Q is the number of phase levels. In the aforementioned design cases (a), (b), and (c), for a wavelength λ1 of 1064 nm, the maximum phase modulation depth is set to be 2 pai and the number of phase levels is chosen to be Q=32 for the above three cases. With fused quartz employed as the material of the phase grating, the refractive index n is equal to 1.45 (for 1064 nm) and therefore the required grating depth h is decided to be 2291 nm. This grating depth gives a maximum phase modulation depth of 4.1 pai, 6.4 pai and 8.9 pai for the wavelengths of 532, 355 and 266 nm, respectively.

For example, the phase grating designed as described above is fabricated as follows. First, a photo-resist film is patterned on a fused quartz substrate by masked exposure or direct laser drawing. Then, the resultant photo-resist pattern is transferred onto the quartz substrate by ion etching to form a surface-relief grating on it.

Figure 8:
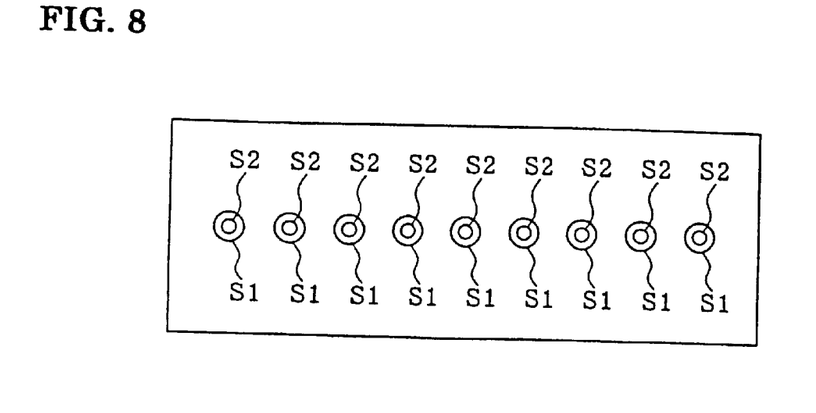
FIG. 8 illustrates the positions being irradiated with diffraction beam arrays of two wavelengths, using the phase grating in accordance with the design condition (a)

FIG. 8 exemplifies the positions being irradiated with diffraction beam arrays of two wavelengths, using the phase grating of design condition (a). Here, the focal spots S2 of the diffraction beam array of wavelength λ2 are positioned in the focal spots S1 of the diffraction beam array of wavelength λ1, with the focal spots Si and S2 superposed one on the other. This makes it possible to perform processing (make holes or the like) on the workpiece with the laser beam of wavelength λ2, while the processing points of the workpiece are being X3 heated with the laser beam of wavelength λ1.

As described above, using the phase grating designed in accordance with the aforementioned design conditions (a), (b), and (c) makes it possible to use light efficiently and provide a diffraction beam array with sufficiently high intensity and uniformity, thereby allowing a plurality of points on the workpiece to be processed uniformly at the same time.

Second Embodiment (For irradiating different positions on a workpiece with two arrays of diffraction beams of different wavelengths)

In this case, there is no particular requirements between the two wavelengths λ1 and λ2. However, to irradiate a workpiece with these diffraction beam arrays under particular conditions as to light-use efficiency, light intensity distribution and the irradiation position, the phase grating used needs to be designed so as to meet these requirements.

Now, described below are three examples of design conditions for the phase grating which is used to irradiate different positions on a workpiece with two arrays of diffraction beams of different wavelengths. Note that all these examples employ the same wavelength combination of λ1=1064 nm and λ2=532 nm.

Example (d)

Number of split beams: 9
Orders of diffraction:

m1=0, ±1, ±2, ±3, ±4 m2=0, ±1, ±2, ±3, ±4

Number of pixels per period: 36
Number of phase levels: 32 (values from 0 to 31)
Maximum phase modulation depth: 2π for 1064 nm
Diffractive properties for 1064 nm: light-use efficiency of 85% and uniformity of 0.90
Diffractive properties for 532 nm: light-use efficiency of 84% and uniformity of 0.92

Figure 9:
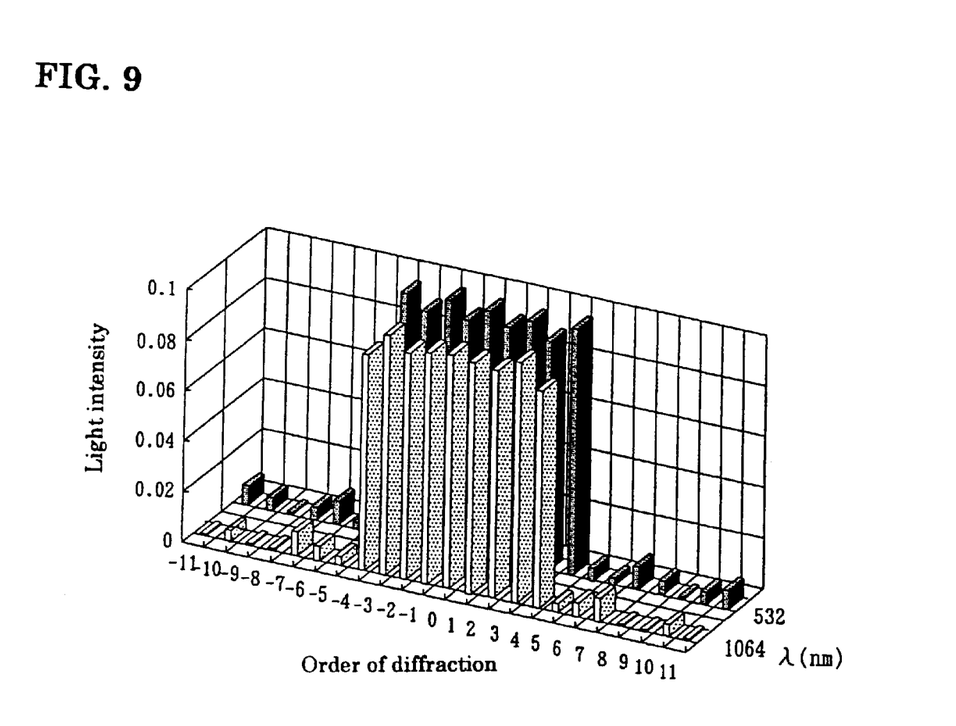
FIG. 9 shows the intensity distribution of beams diffracted by the phase grating in accordance with the design condition (d)

Incidentally, FIG. 9 illustrates the intensity distribution of beams diffracted by the phase grating for this case.

Example (e)

Number of split beams: 13
Orders of diffraction:

m1=0, ±1, ±2, ±3, ±4, ±5, ±6 m2=0, ±1, ±2, ±3, ±4, ±5, ±6

Number of pixels per period: 40
Number of phase levels: 32 (values from 0 to 31)
Maximum phase modulation depth: 2π for 1064 nm
Diffractive properties for 1064 nm: light-use efficiency of 83% and uniformity of 0.94

Diffractive properties for 532 nm: light-use efficiency of 86% and uniformity of 0.95

Figure 10:
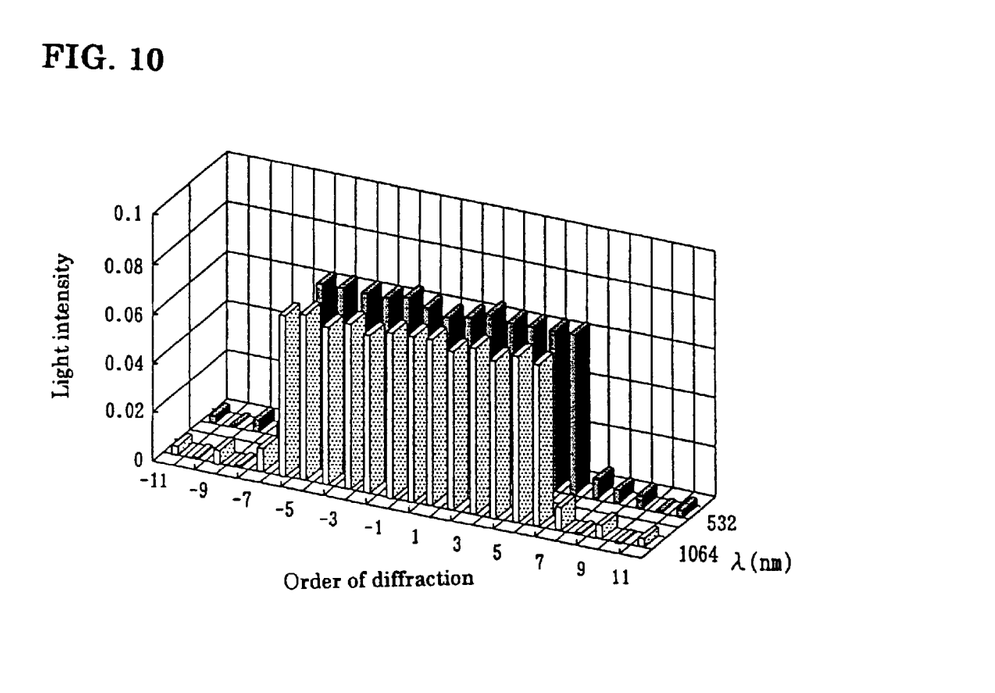
FIG. 10 shows the intensity distribution of beams diffracted by the phase grating. in accordance with the design condition (e)

Incidentally, FIG. 10 illustrates the intensity distribution of beams diffracted by the phase grating for this case.

Example (f)

Number of split beams: 17
Orders of diffraction:

$m1=0, \pm1, \pm2, \pm3, \pm4, \pm5, \pm6, \pm7, \pm8$ $m2=0, \pm1, \pm2, \pm3, \pm4, \pm5, \pm6, \pm7, \pm8$

Number of pixels per period: 42
Number of phase levels: 32 (values from 0 to 31)
Maximum phase modulation depth: $2\pi$ for 1064 nm
Diffractive properties for 1064 nm; light-use efficiency of 85% and uniformity of 0.92
Diffractive properties for 532 nm: light-use efficiency of 84% and uniformity of 0.95

Figure 11:
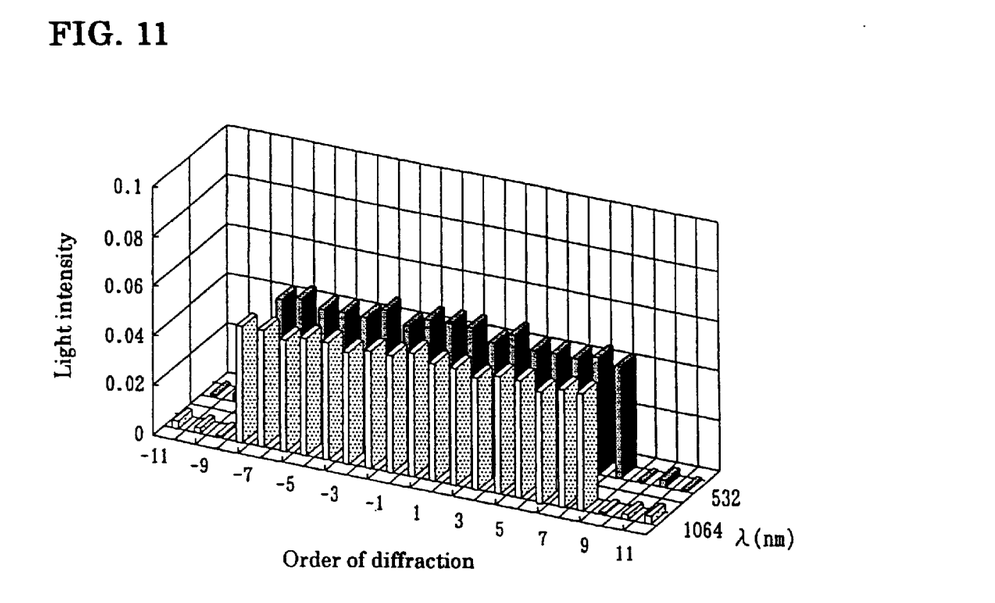
FIG. 11 shows the intensity distribution of beams diffracted by the phase grating in accordance with the design condition (f)

Incidentally, FIG. 11 illustrates the intensity distribution of beams diffracted by the phase grating for this case.

Figure 12:
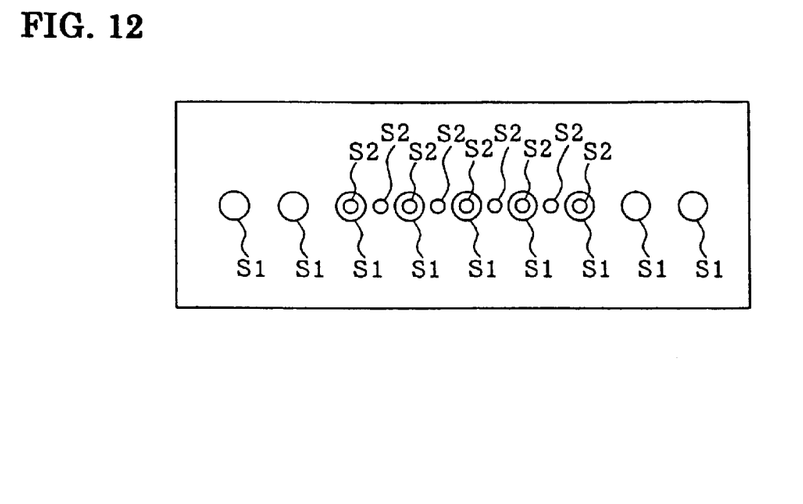
FIG. 12 illustrates the positions being irradiated with diffraction beam arrays of two wavelengths, using the phase grating in accordance with the design condition (d)

FIG. 12 exemplifies the positions being irradiated with diffraction beam arrays of two wavelengths, using the phase grating in accordance with the aforementioned design condition (d). Here, some of the focal spots S2 of the diffraction beam A array of wavelength $\lambda2$ are located in the focal spots S1 of the diffraction beam array of wavelength $\lambda1$, while the other focal spots S2 are located between the focal spots S1. In this case, for example, deep holes may be processed at positions on which the focal spots S1 and S2 impinge, while shallow holes may be processed at the other positions on which only the spots S2 impinge.

In addition, suppose that the two wavelengths are provided with different numbers of beam splits, for example, a wavelength of 1064 nm is provided with nine splits and a wavelength of 532 nm with 17 splits. In this case, deep holes and shallow holes can be formed alternately in line.

As described above, using the phase grating designed in accordance with the aforementioned design conditions (d), (e), and (f), makes it possible to use light efficiently and provide a diffraction beam array with sufficiently high intensity and uniformity, thereby allowing a plurality of points on the workpiece to be processed uniformly at the same time.

Now, discussed below is the focal spot width w of a diffraction beam array on a workpiece. The focal spot width w can be estimated by $$w=2\lambda f/D \quad (11)$$

where $\lambda$ is the wavelength of the laser beam, f is the focal length of the condenser lens, and D is the diameter of the laser beam incident upon the phase grating.

To adjust the focal spot width of diffraction beams of two wavelengths $\lambda1$ and $\lambda2$ to a needed width, a beam expander may be disposed in the optical path of each laser beam to adjust the beam diameter individually. This can be applied to both the first and second embodiments.

Figure 13:
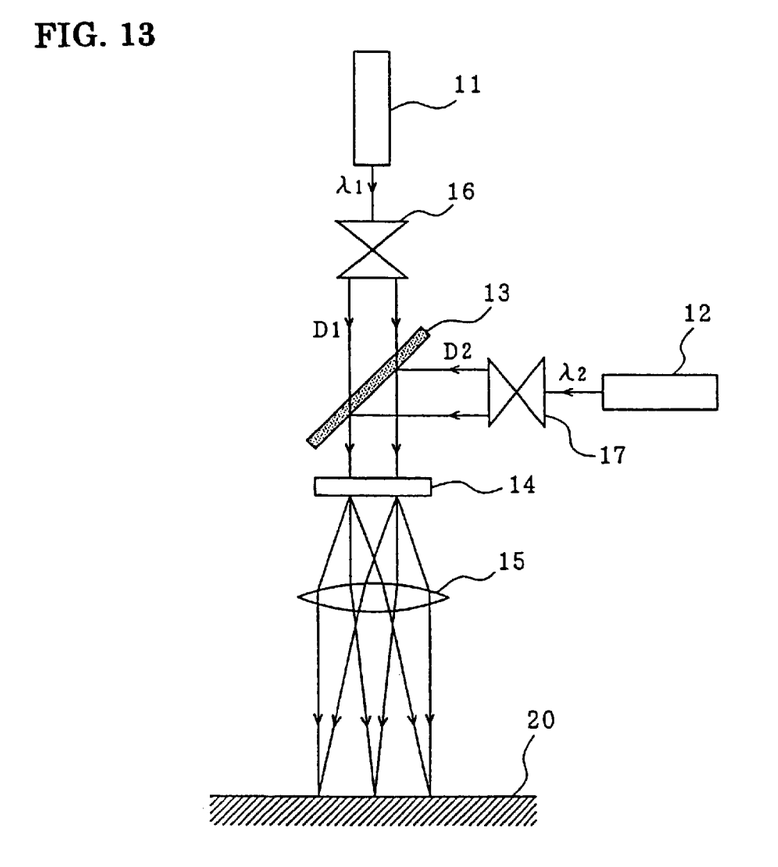
FIG. 13 illustrates the arrangement of the laser processing apparatus of FIG. 1 incorporating beam expanders.

FIG. 13 illustrates the arrangement of a laser processing apparatus having beam expanders 16 and 17, disposed in each optical path of the laser beams of wavelengths $\lambda1$ and $\lambda2$, for adjusting the beam width. The beam expanders 16 and 17 can be used to make it possible to vary the wavefront curvature. For combinations of two wavelengths being not in relation of integer multiples, the adjustment of the wavefront curvature and the appropriate selection of diffraction orders in unison allow the diffraction beam arrays of the respective wavelengths to impinge on the same positions on a workpiece.

In addition, the focal spot of the wavelength $\lambda1$ can be made the same in diameter as that of the wavelength $\lambda2$, thereby making it possible to perform processing with higher accuracy and higher efficiency. To make the focal spots of diffraction beams of two wavelengths $\lambda1$ and $\lambda2$ equal in diameter to each other, it follows from the equation (11) that the diameters D1 and D2 of the laser beams of the respective wavelengths should be decided so as to satisfy the following relation.

$$D1/D2=\lambda1/\lambda2 \quad (12)$$

Third Embodiment

Figure 14:
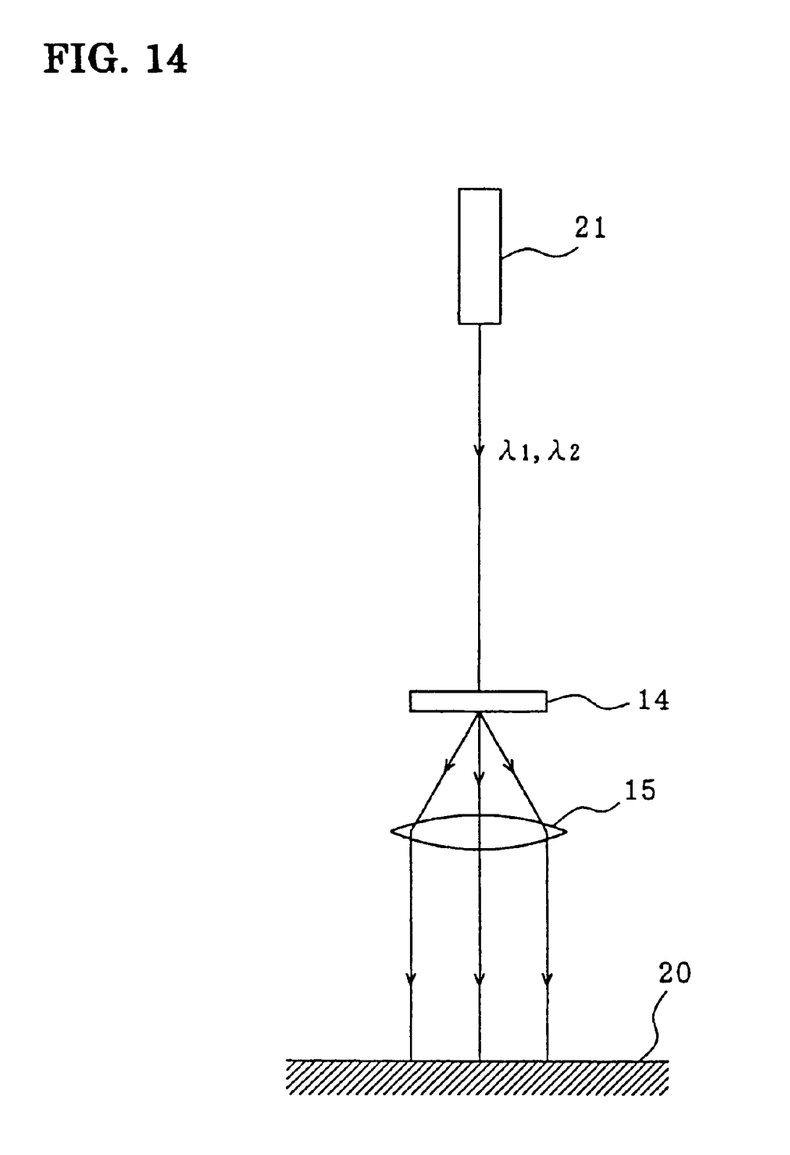
FIG. 14 illustrates the arrangement of a laser processing apparatus to be used in a third embodiment.

FIG. 14 illustrates the arrangement of another embodiment according to the present invention. A laser processing apparatus according to this embodiment includes a single third laser 21 capable of emitting a plurality of laser beams of different wavelengths. The apparatus also includes the phase grating 14 designed to serve for two different wavelengths as explained above and the achromatic condenser lens 15. FIG. 14 illustrates an example of a laser processing apparatus which employs a type of laser that emits two wavelengths ($\lambda1$ and $\lambda2$) at the same timing to irradiate the workpiece 20 simultaneously with pulses of wavelengths $\lambda1$ and $\lambda2$.

Figure 15:
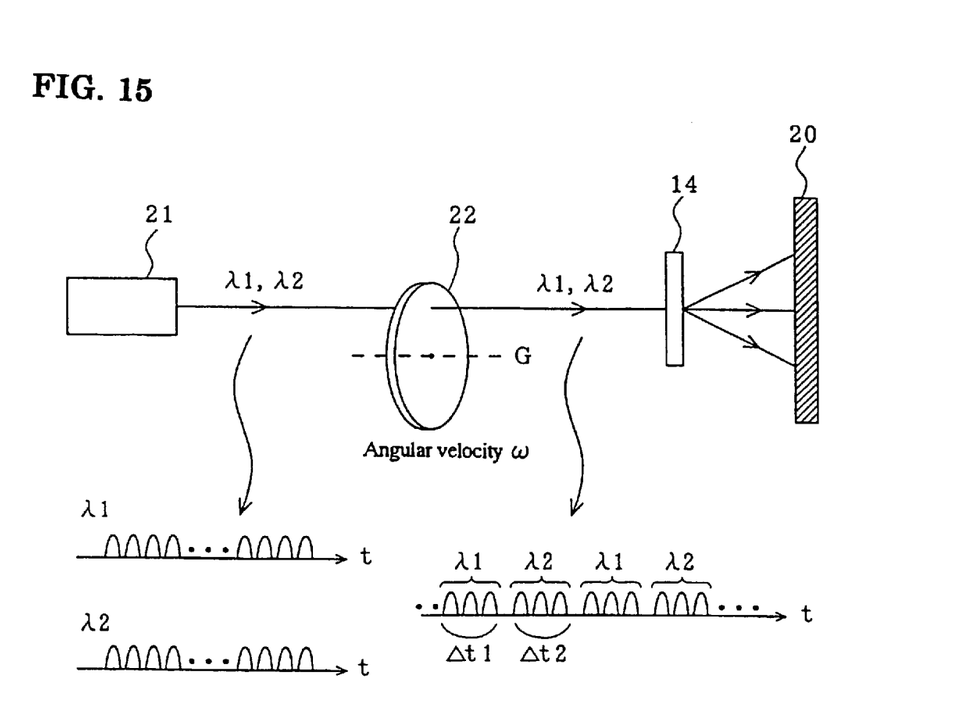
FIG. 15 illustrates the arrangement of the laser processing apparatus in FIG. 14 incorporating a rotary disc having wavelength-selective filters, each of which transmits its own specific wavelength.

On the other hand, suppose that the workpiece is irradiated with two types of laser beam pulses of wavelengths $\lambda1$ and $\lambda2$ at different time intervals. In this case, it is necessary to provide spectroscopic means, in the laser beam path of the apparatus of FIG. 14, for separating individual laser beams of particular wavelengths ($\lambda1$ and $\lambda2$). FIG. 15 illustrates a laser processing apparatus having a rotary disc 22 with filters disposed alternately for transmitting a particular wavelength ($\lambda1$ or $\lambda2$), the rotary disc 22 serving to alternately transmit the pulses of wavelengths $\lambda1$ and $\lambda2$.

Figure 16:
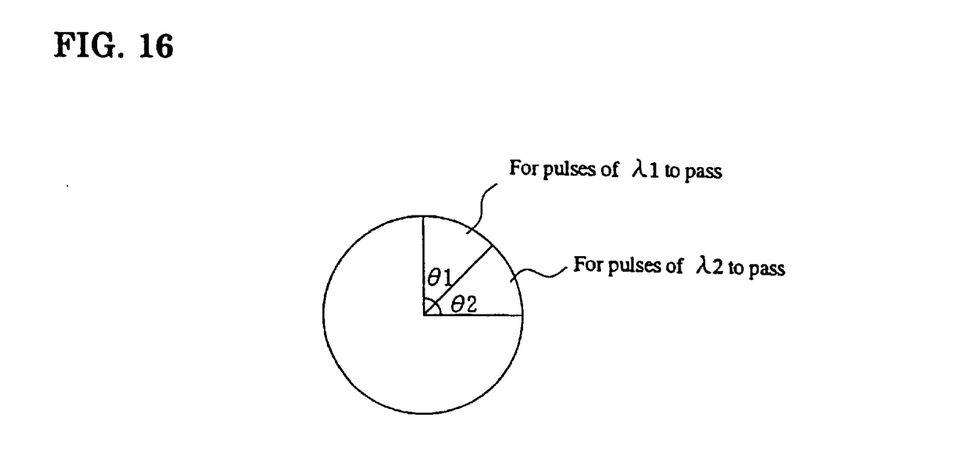
FIG. 16 illustrates an example of the rotary disc in FIG. 15.

An example of the rotary disc 22 is shown in FIG. 16. The rotary disc 22 transmits the laser beam of wavelength $\lambda1$ through the region within an angle of $\theta1$ radian, while transmitting the laser beam of wavelength $\lambda2$ through the region within an angle of $\theta2$ radian. The angular velocity $\omega$ of the rotary disc can be expressed by the following equation.

$$\omega=\theta1/\Delta t1=\theta2/\Delta t2 \quad (13)$$

For example, with the laser frequency of 1 khz and the angular velocity of $\omega=10$ pai, laser beam pulses of wavelengths $\lambda1$ and $\lambda2$ are transmitted alternately for every 100 pulses, with $\Delta$ t1=$\Delta$t2=0.1 seconds and $\theta1=\theta2=$pai($\pi$).

Incidentally, the rotary disc 22 is not necessary when the third laser 21 emits laser beam pluses of two different wavelengths at different timings.

The laser processing apparatus according to the third embodiment employs only a single laser, thereby making it possible to simplify the. structure of the apparatus.

Incidentally, each of the aforementioned embodiments has the phase grating 14 disposed in front of the condenser lens 15. However, it is also possible to dispose the phase grating 14 between the condenser lens 15 and the workpiece 20 and then change the position of the phase grating 14 in the direction of the resultant optical axis after the emitted laser beams combined, thereby adjusting the impinging positions of diffraction beams onto the workpiece.

In addition, each of the aforementioned embodiments has a one-dimensional phase grating as a means to split laser beam. What holds true in these embodiments can be applied to cases with a two-dimensional phase grating in cause-and-effect terms.

AS for grating design, such parameters as the phase modulation depth, the number of phase levels and the number of pixels per period can be altered in consideration of the wavelengths to be used and the diffractive properties to be accomplished. For example, the aforementioned phase grating has employed the design criterion that the diffraction beam arrays are substantially uniform (with uniformity of 0.90 or more). However, it is possible to create a non-uniformity distributed intensity of a diffraction beam array. It is also possible to provide a difference in split performance between the two wavelengths.

Furthermore, it is possible to fabricate a phase grating that serves for three or more different wavelengths, and that is to say, the present invention basically works regardless of the number of wavelengths to be used.

For reference purposes, shown below is a design case (g) that employs three wavelengths of 1064 nm, 532 nm and 355 nm.

Example (g)

Number of split beams: 9
Orders of diffraction:

$m1=0, \pm1, \pm2, \pm3, \pm4$ $m2=0, \pm2, \pm4, \pm6, \pm8$ $m3=0, \pm3, \pm6, \pm9, \pm12$

Number of pixels per period: 80
Number of phase levels: 64 (values from 0 to 63)
Maximum phase modulation depth: $2\pi$ for 1064 nm
Diffractive properties for 1064 nm: light-use efficiency of 73% and uniformity of 0.86
Diffractive properties for 532 nm: light-use efficiency of 78% and uniformity of 0.95
Diffractive properties for 355 nm: light-use efficiency of 80% and uniformity of 0.98

Figure 17:
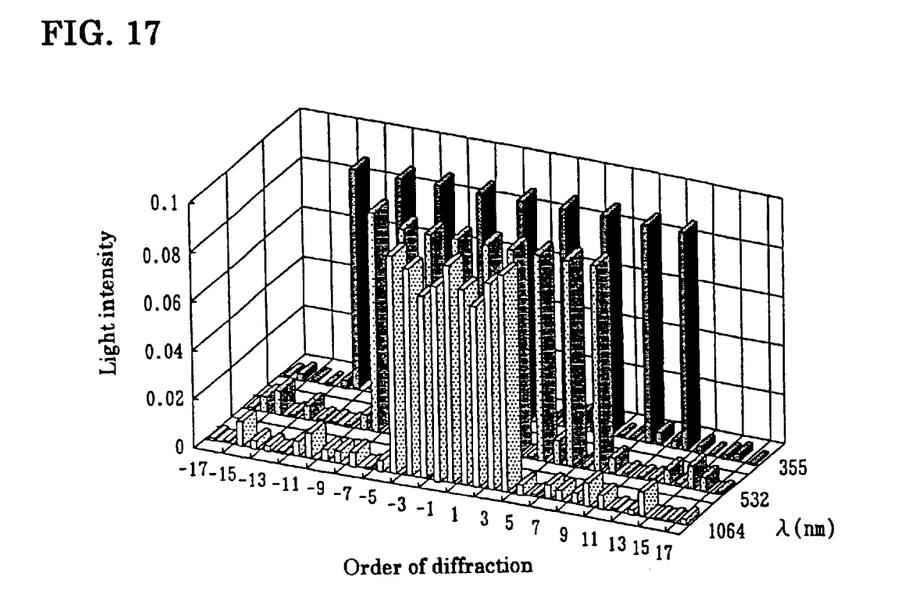
FIG. 17 shows the intensity distribution of beams diffracted by the phase grating in accordance with the design condition (g)

Incidentally, FIG. 17 illustrates the intensity distribution of beams diffracted by the phase grating for this case.

According to the laser processing method of the present invention, a common phase grating is employed to split a plurality of laser beams of different wavelengths into designed arrays of diffraction beams, thereby making it possible to simplify the configuration of the laser processing apparatus.

Furthermore, the laser processing apparatus according to the present invention is provided with a simplified optical system in comparison with the prior-art one, thereby making it possible to facilitate the adjustment of the optical system in order to obtain most suitable processing conditions for individual applications.

While there has been described what are at present considered to be preferred embodiments of the invention, it will be understood that various modifications may be made thereto, and it is intended that-the appended claims cover all such modifications as they fall within the true spirit and scope of the invention.

What is claimed is:

1. A method for laser processing, comprising the steps of;
splitting a plurality of laser beams of different wavelengths into diffraction beams in a designed arrays, respectively, by using a common phase grating, and
directing the diffraction beams to a workpiece to focus and impinge on processing points of the workpiece to thereby process the workpiece.

2. The method for laser processing according to claim 1, wherein
the diffraction beams of different wavelengths impinge on the same positions on the workpiece.

3. The method for laser processing according to claim 2, further comprising the steps of;
providing a beam adjusting unit for adjusting the diameter of each laser beam in its optical path to the phase grating so that the diffraction beams focused at the same positions have the same focal spot diameter at each impinging position on the workpiece.

4. The method for laser processing according to claim 1, wherein each diffraction array of an individually different wavelength has a substantially uniform intensity distribution.

5. The method for laser processing according to claim 1, further comprising the steps of; shifting the phase grating along the resultant optical axis after emitted laser beams combined to adjust the impinging positions of the diffraction beams on the workpiece.

6. The method for laser processing according to claim 1, wherein two laser beams of different wavelengths are used as the plurality of laser beams.

7. A laser processing apparatus comprising;
a laser means consisting of at least a single laser for emitting a plurality of laser beams of different wavelengths,
a common phase grating for splitting each of the laser beams of different wavelengths into diffraction beams in a designed array, and
a condenser for condensing the diffraction beams.

8. A laser processing apparatus comprising;
a laser means consisting of at least a single laser for emitting a plurality of laser beams of different wavelengths,
a common phase grating for splitting each of the laser beams of different wavelengths into diffraction beams in a designed array, and
a condenser for condensing the laser beams incident upon the phase grating.

9. The laser processing apparatus according to claim 7, wherein the laser means consists of a single laser for emitting a plurality of laser beams of different wavelengths.

10. The laser processing apparatus according to claim 9, wherein a spectroscopic device for passing individual pulses of different wavelengths during a time duration assigned to each wavelength is disposed between the laser and the phase grating.

11. The laser processing apparatus according to claim 7, wherein the laser means consists of lasers each of which emits a laser beam to provide the plurality of laser beams of different wavelengths.

12. The laser processing apparatus according to claim 7, wherein the laser beams of different wavelengths are two laser beams of wavelengths $\lambda1$ and $\lambda2$, satisfying that $m1\lambda1=m2\lambda2$, where m1 and m2 are diffraction orders of diffraction beams split by the phase grating.

13. The laser processing apparatus according to claim 7, wherein a beam adjusting unit for adjusting the diameter of a laser beam emitted from the laser means is disposed in its optical path to the phase grating.

14. The laser processing apparatus according to claim 7, wherein the phase grating is disposed in a way that it can be positioned in the direction of a resultant optical axis after the emitted laser beams combined.

15. The laser processing apparatus according to claim 7, wherein the condenser is achromatic.

* * * * *